United States Patent
Manor

(10) Patent No.: US 7,474,259 B2
(45) Date of Patent: Jan. 6, 2009

(54) TRAFFIC SENSOR AND METHOD FOR PROVIDING A STABILIZED SIGNAL

(75) Inventor: Dan Manor, Ontario (CA)

(73) Assignee: EIS Electronic Integrated Systems Inc., Toronto (CA)

( * ) Notice: Subject to any disclaimer, the term of this patent is extended or adjusted under 35 U.S.C. 154(b) by 507 days.

(21) Appl. No.: 11/223,982

(22) Filed: Sep. 13, 2005

(65) Prior Publication Data

US 2007/0236365 A1 Oct. 11, 2007

(51) Int. Cl.
*G01S 7/40* (2006.01)

(52) U.S. Cl. ............... 342/174; 342/27; 342/77; 342/175; 342/109; 342/100; 340/933; 340/934; 340/905; 701/117; 701/119

(58) Field of Classification Search ............ 342/174
See application file for complete search history.

(56) References Cited

U.S. PATENT DOCUMENTS

| | | | |
|---|---|---|---|
| 4,335,382 A * | 6/1982 | Brown et al. ............. 342/104 |
| 4,967,201 A | 10/1990 | Rich, III | |
| 4,977,406 A | 12/1990 | Tsukamoto et al. | |
| 5,161,107 A | 11/1992 | Mayeaux et al. | |
| 5,402,346 A | 3/1995 | Lion et al. | |
| 5,423,080 A | 6/1995 | Perret et al. | |
| 5,621,645 A | 4/1997 | Brady | |
| 5,663,720 A | 9/1997 | Weissman | |
| 5,694,134 A | 12/1997 | Barnes | |
| 5,793,491 A | 8/1998 | Wangler et al. | |
| 5,798,983 A | 8/1998 | Kuhn et al. | |
| 5,878,367 A | 3/1999 | Lee et al. | |
| 5,884,212 A | 3/1999 | Lion | |
| 5,920,280 A | 7/1999 | Okada et al. | |
| 5,935,190 A | 8/1999 | Davis et al. | |
| 5,949,383 A | 9/1999 | Hayes et al. | |
| 6,114,973 A | 9/2000 | Winner et al. | |
| 6,411,249 B1 * | 6/2002 | Rose ....................... 342/13 |
| 6,556,916 B2 * | 4/2003 | Waite et al. ............. 701/117 |
| 6,570,460 B1 * | 5/2003 | Dussauby et al. ......... 331/96 |

(Continued)

FOREIGN PATENT DOCUMENTS

EP 0127337 12/1984

(Continued)

OTHER PUBLICATIONS

International Search Report for International Application No. PCT/CA2006/001229.

(Continued)

*Primary Examiner*—Thomas H Tarcza
*Assistant Examiner*—Timothy A Brainard
(74) *Attorney, Agent, or Firm*—Bereskin & Parr

(57) ABSTRACT

A traffic sensor is mounted at a fixed location to monitor multiple lanes of traffic. The traffic sensor (a) generates a programmable time-varying modulating signal; (b) generates a modulated microwave signal based on the programmable time-varying modulating signal; (c) radiates the modulated microwave signal in a radiation beam at an object; (d) provides a proportional calibration signal based on the modulated microwave signal; (e) measures parameters of the calibration signal, and (f) corrects the programmable time-varying modulating signal based on the parameters of the calibration signal.

18 Claims, 4 Drawing Sheets

U.S. PATENT DOCUMENTS

| | | | |
|---|---|---|---|
| 6,577,269 | B2 | 6/2003 | Woodington et al. |
| 6,693,557 | B2 | 2/2004 | Arnold et al. |
| 6,750,787 | B2 | 6/2004 | Hutchinson |
| 2004/0017312 | A1* | 1/2004 | Anderson et al. ............ 342/457 |
| 2004/0178946 | A1* | 9/2004 | Kato et al. .................. 342/100 |
| 2004/0260422 | A1* | 12/2004 | Greenwood et al. .......... 700/193 |
| 2005/0118970 | A1* | 6/2005 | Nara ........................ 455/226.1 |
| 2006/0125559 | A1* | 6/2006 | Garbi et al. ................. 330/149 |

FOREIGN PATENT DOCUMENTS

| | | |
|---|---|---|
| EP | 0988559 | 3/2000 |
| WO | WO 03/027986 | 4/2003 |

OTHER PUBLICATIONS

Written Opinion of the International Searching Authority for International Application No. PCT/CA2006/001229 Nov. 17, 2006.

RTMS User Manual Issue 3.2 by EIS, describing the automatic set up and lane configuration pp. 9-13—Publication date Apr. 2004.

SmarTek Acoustic Sensor Version 1 Installation and Setup Guide Jul. 25, 2000.

A Photo Showing the RTMS model XX3 from inside—Release date Sep. 2003.

RTMS User Manual Issue 3.2 by EIS, describing the configuration of a traffic sensor currently in production by EIS—RTMS model X3—Publication dated Apr. 2004.

Berka S., Kent Lall B. and Fellow, ASCR: "New Perspectives for ATMS: Advanced Technologies in Traffic Detection"—Journal of Transportation Engineering, Jan./Feb. 1998.

Kim I.S., Jeong K., Kwon Jeong J.: "Two Novel Radar Vehicle Detectors for the Replacement of a Conventional Loop Detector"—Microwave Journal, vol. 44, No. 7, Jul. 2001, pp. 22, 26-28, 32, 35, 38, 40.

Krämer G.: "Envisioning a Radar-Based Automatic Road Transportation System"—Intelligent Transportation Systems, May/Jun. 2001, pp. 75-77.

Dailey D.J.: "A Statistical Algorithm for Estimating Speed from Single Loop Volume and Occupancy Measurements", Transportation Research Board, Part B33 (1999), pp. 133-136.

Stewart B.D., Reading I., Thomson, M.S., Binnie T.D., Dickinson K.W., Wan C.L.: "Adaptive Lane Finding In Road Traffic Image Analysis"—Road Traffic Monitoring and Control, Apr. 26-28, 1994, Conference Publication No. 391, IEE, 1994.

Smith R.L., Arnold D.V.; "Development of a Low Cost, FM/CW Transmitter for Remote Sensing"—Vehicle Detector Workshop TexITE Jun. 2000.

Unknown; "Loren Multi-Lane Microwave Detector"—Electronique Controle Mesure, date unknown.

Unknown; "RTMS Radar Traffic Detection—General Information", EIS Integrated Sysems Inc., Jul. 21, 2001, pp. 1-6.

Lion D.; "Radar for Automatic Incident Detection and Traffic Analysis: The Beatrics Sensors"—Proceedings of the First World Congress on Applications of Transport Telematics and Intelligent Vehicle-Highway Systems 1995 ERTICO, pp. 1285-1290.

Ma B., Lakshmanan S., Hero A.; "Road and Lane Edge Detection with Multisensor Fusion Methods"—0-7803-5467-2/99 1999 IEEE.

Gern A., Franke U.; "Advanced Lane Recognition—Fusing Vision and Radar"—Proceedings of the IEEE Intelligent Vehicles Symposium 2000, Oct. 3-5, 2000, pp. 45-51.

Gonzalez J.P., Ozguner, U.; "Lane Detection Using Histogram-Based Segmentation and Decision Trees"—2000 IEEE Intelligent Transportation System Conference Proceedings, Oct. 1-3, 2000, pp. 346-351.

Frederick J.D., Qian Y. and Itoh, T; "A Novel Single Card FMCW Radar Transceiver with On Board Monopulse Processing"—no date.

Unknown; "Accuwave LX-150 Microwave Detector"—no date.

Unknown; "Task Force L Final Report"—Executive Summary, pp. 1-40, Jan. 16, 2002.

Unknown; "Sensors"—Transportation Operations Group, Vehicle Detection Workshop, Tex/TE Jun. 2000, pp. 1 of 13, 2 of 13, 11, 12.

Unknown; "RTMS Traffic Detector Primer"—EIS Electronic Integrated Systems Inc. Jul. 21, 2001, pp. 1-4.

Unknown; "Automatic Lane Detection"—no date.

Beard J.C. and Arnold D.V.; "6GHx Range Finder Using Pulse Compression"—IGARSS 2000.

Derneryd A.G.; "Linearly Polarized Microstrip Antennas"—IEEE Transactions on Antenna and Propagation, Nov. 1976, pp. 846-851.

Kranig J., Minge, E. Jones C.; "Field Test of Monitoring of Urban Vehicle Operations Using Non-Intrusive Technologies"—Final Report—FHWA-PL-97-018, Part IV—Department of Transportation Federal Highway Administration, May 1997.

Middleton D. and Parker R.; "Initial Evaluation of Selected Detectors to Replace Inductive Loops on Freeways"—Report 1439-7—Apr. 2000.

Unknown; "Detection Technology: for IVHS—vol. 1: Final Report Addendum" Publication No. FHWA-RD-96-100, Publication Date: Jul. 1995 (§ 12).

SmarTek Acoustic Sensor—Version 1 (SAS-1)—Installation and Setup Guide, Jul. 25, 2005.

Unknown: "On-Bench Photographs of Detectors"—pp. 1-9, Jan. 16, 2002.

* cited by examiner

TRAFFIC SENSOR AND METHOD FOR PROVIDING A STABILIZED SIGNAL

FIELD OF THE INVENTION

The present invention relates in general to traffic sensors, and more particularly relates to a traffic sensor and method for providing a stabilized signal.

BACKGROUND OF THE INVENTION

As urban centers increase in size, and traffic congestion becomes more common, the need for accurate and up-to-date traffic information also increases. Traffic surveillance relies primarily on traffic sensors, such as inductive loop traffic sensors that are installed under the pavement. Alternatively, video sensors may also be used to obtain traffic information.

Residing underground, inductive loop sensors are expensive to install, replace and repair because of the associated roadwork required. Moreover, such roadwork also causes traffic disruptions. Video sensors, on the other hand, are cheaper, but have other drawbacks, such as an inability to operate in the dark or in weather that impairs visibility, such as fog or snow.

To overcome these drawbacks, radar sensors have been employed to obtain traffic information. Radar sensors typically transmit low-power microwave signals at the traffic, and detect vehicles based on the reflected signals. Radar sensors are generally cheaper than inductive loop traffic sensors, and, unlike video sensors, operate in the dark and in a wide range of weather conditions.

For proper and stable operation, frequency modulated continuous wave (FMCW) radars must transmit a stable and preferably linear frequency sweep. Any non-linearities of the sweep can reduce range resolution. Further, changes in the df/dt sweep slope due to temperature drift may reduce the accuracy of ranges measured, and shifts in the center frequency due to temperature changes can push the transmission signal out of the FCC allocated band.

One solution to this problem involves digitally synthesizing the radar transmit signal such that at all times it is derived to be some numerical multiple of a fixed low crystal-controlled reference frequency; however, this approach tends to be expensive both in terms of production cost and power consumption.

Another approach adopted is to rely on an analog oscillator to generate the transmit signal. In this case the frequency modulation would be performed by a single varactor diode. The main drawbacks of this approach are non-linearity and temperature drifts. One solution is to provide a frequency generation oscillator (FGO) circuit with a memory chip. This memory would be loaded with numbers defining a function derived from the polynomial $N(x)=Ax^2+Bx+C$ in which the A coefficient denotes the non-linear part, the B coefficient denotes the primary modulation slope and the C coefficient relates to the center frequency.

By testing each transceiver after manufacture, its A, B and C coefficients can be determined and recorded in the memory resulting in a linearized sweep, and substantially correct slope and center frequency as required. Further, through a combination of real-time temperature measurement and statistical analysis of batches of microwave transceivers, temperature correction can be applied to the A, B and C coefficients so as to stabilize the sweep function and center frequency by compensating for variation in these coefficients due to temperature. However, despite this compensation, there may be substantial drift of the df/dt slope. Accordingly, this approach while being cheaper both in terms of cost and power consumption than the above-described digital solution, may suffer from the drawback of reduced accuracy.

SUMMARY OF THE INVENTION

In accordance with an aspect of the present invention there is provided a vehicular traffic sensor for mounting at a fixed location to monitor multiple lanes of traffic. The vehicular traffic sensor comprises: (a) a processor unit for generating a programmable time-varying modulating signal; (b) a transceiver unit for receiving the programmable time-varying modulating signal from the processor unit and for generating a modulated microwave signal based on the programmable time-varying modulating signal; (c) at least one antenna for (i) receiving the modulated microwave signal from the transceiver unit, (ii) forming a radiation beam, (iii) radiating the modulated microwave signal in the radiation beam at an object; and, (iv) receiving the modulated microwave signal reflected back from the object; and (d) a signal stabilizing unit for receiving a portion of the modulated microwave signal from the transceiver unit and for providing a proportional calibration signal back to the processor. The processor unit is further operable to (i) receive the calibration signal from the signal stabilizing unit, (ii) measure parameters of the calibration signal, and (iii) correct the programmable time-varying modulating signal based on the parameters of the calibration signal.

In accordance with a second aspect of the present invention, there is provided a method of operating a traffic sensor for mounting at a fixed location to monitor multiple lanes of traffic. The method comprises: (a) generating a programmable time-varying modulating signal; (b) generating a modulated microwave signal based on the programmable time-varying modulating signal; (c) radiating the modulated microwave signal in a radiation beam at an object; (d) providing a proportional calibration signal based on the modulated microwave signal; (e) measuring parameters of the calibration signal, and (f) correcting the programmable time-varying modulating signal based on the parameters of the calibration signal.

BRIEF DESCRIPTION OF THE DRAWINGS

A detailed description of preferred embodiments is provided herein below with reference to the following drawings, in which.

DETAILED DESCRIPTION OF PREFERRED EMBODIMENTS

Figure 1:
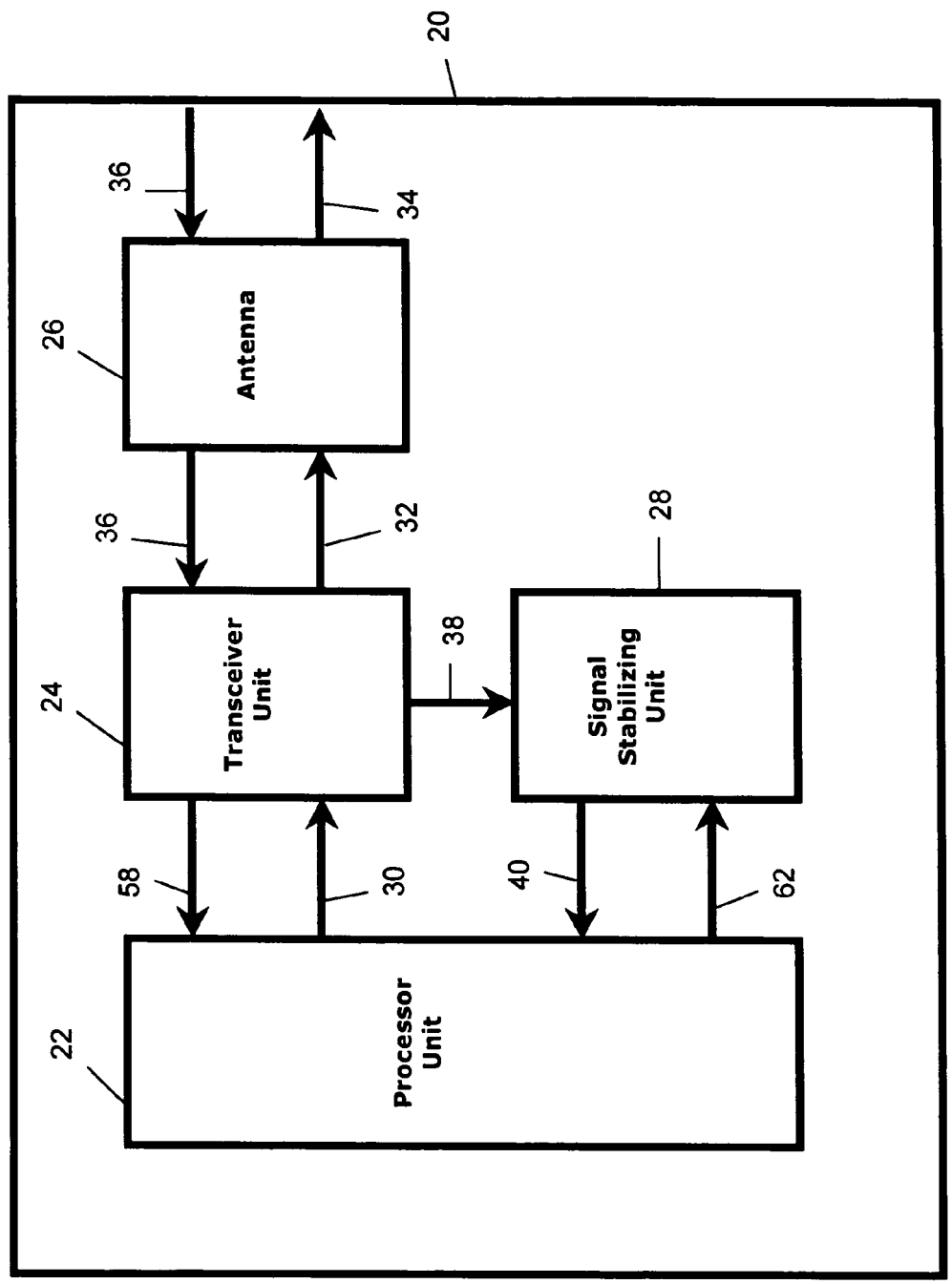
FIG. 1, in a block diagram illustrates a traffic sensor in accordance with an aspect of the present invention.

Referring to FIG. 1, there is illustrated in a block diagram a traffic sensor 20 in accordance with an aspect of the present invention. The traffic sensor 20 comprises a processor unit 22, a transceiver unit 24, an antenna 26 and a signal-stabilizing unit 28. The processor unit 22 generates a programmable time-varying modulating signal 30 that is received by the transceiver unit 24. The transceiver unit 24 takes the programmable time-varying modulating signal and generates a modulated microwave signal 32 that is received by the antenna 26. The antenna 26 then forms a radiation beam and radiates the modulated microwave signal 32 in the radiation beam 34 at an object or objects, such as a vehicle (not shown) or several vehicles. The antenna 26 also receives back from the object a reflected modulated microwave signal 36.

The signal-stabilizing unit 28 receives a calibration portion 38 of the modulated microwave signal 32. The signal-stabilizing unit 28 then derives a proportional calibration signal 40, which is transmitted back to the processor unit 22. The processor unit 22 is further operable to measure parameters of the calibration signal 40 and to correct the programmable time varying modulating signal 30 based on the parameters of the calibration signal 40. A more detailed description of the operation of the transceiver unit 24, signal stabilizing unit 28 and processor unit 22 is provided below.

Figure 2:
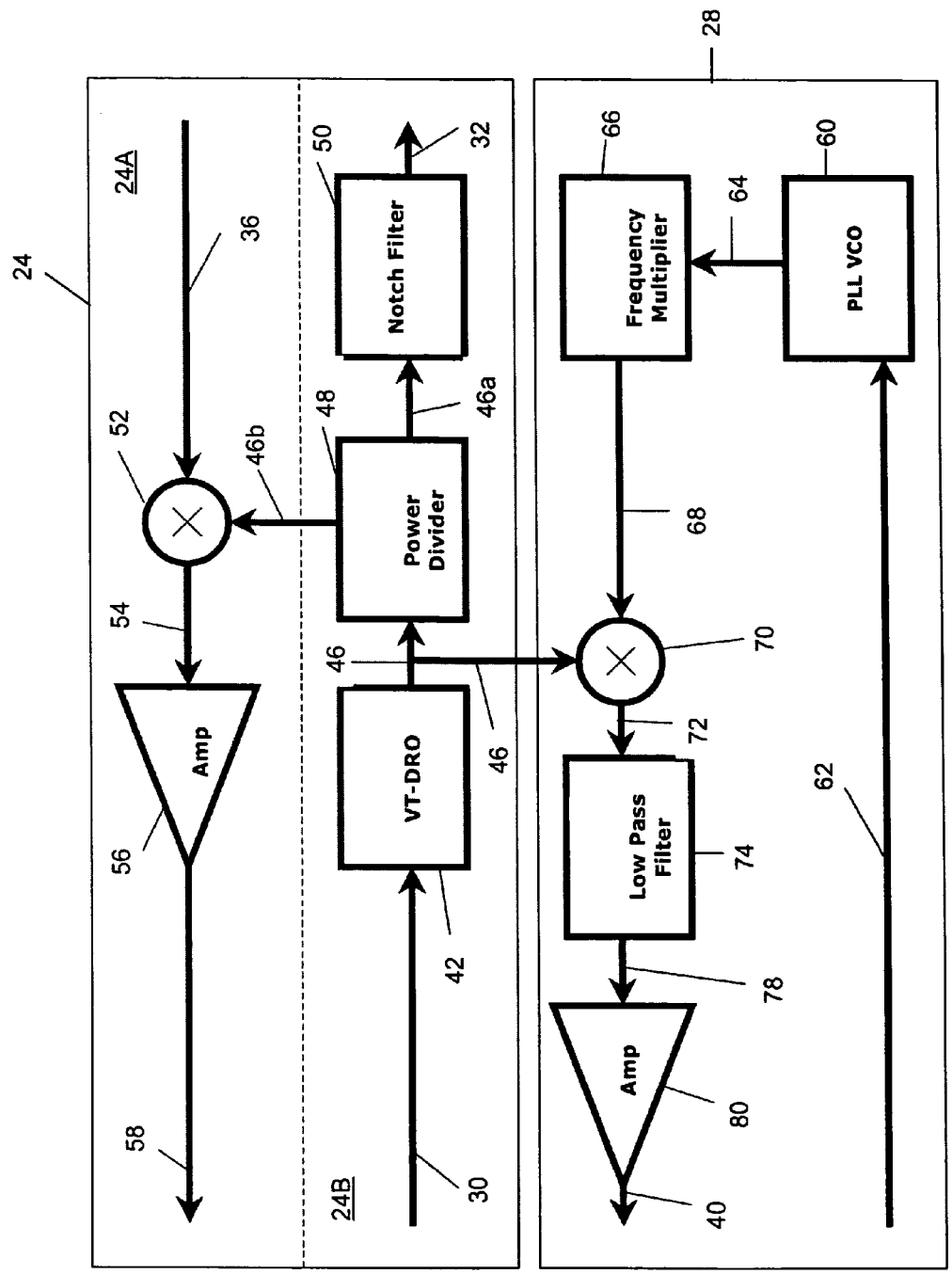
FIG. 2, in a block diagram illustrates a transceiver unit and a signal stabilizing unit of the traffic sensor of FIG. 1.

Referring to FIG. 2, the transceiver unit 24 and the signal-stabilizing unit 28 are illustrated in more detail in a block diagram. As shown, the transceiver unit 24 comprises a receiver unit 24A and a transmitter unit 24B. The transmitter unit 24B receives the programmable time-varying modulator signal 30 and transmits the modulated microwave signal 32. The receiver unit 24A receives the reflected modulated microwave signal 36 from the antenna 26.

The transmitter unit 24B comprises a voltage tunable dielectric resonator oscillator (VT-DRO) 42, which outputs a microwave signal 46 whose frequency is determined by the programmable time-varying modulating signal 30 input to the VT-DRO 42. The transmitter unit 24B further comprises a power divider 48 that divides the microwave signal 46 into two signals 46a and 46b. Typically the power divider 48 is a circuit that accepts an input signal and delivers multiple output signals equal in phase and in a fixed amplitude ratio.

The generation of microwave signal 46 by the VT-DRO 42 may introduce unwanted distortions at specific frequencies. To remove these unwanted distortions from the modulated microwave signal 32 provided to the antenna 26, a notch filter 50 is included in the transmitter unit 24B. The notch filter 50 receives the divided signal 46a and produces modulated microwave signal 32 by passing through most of the frequencies of divided signal 46a unaltered, while attenuating those in a narrow range to very low levels. In one embodiment, the notch filter 50 is a 21 GHz distributed notch filter selected to remove harmonic distortions introduced to the transmitted signal 46a by the VT-DRO 42.

The receiver unit 24A receives the reflected modulated microwave signal 36 from the antenna 26. The receiver unit 24A comprises a mixer 52, which effectively multiplies divided signal 46b from power divider 48 and reflected modulated microwave signal 36 together to generate a mixed signal 54. The mixed signal 54 is at the base band, in that it is determined as the difference in frequency between the reflected modulated microwave signal 36 and the signal 46b, which difference in frequency represents the time elapsed between transmission and reception of the modulated microwave signal. This time elapsed, in turn, represents the distance to the object from which the signal was reflected. The mixed signal 54 is received by an amplifier 56, which produces an amplified signal 58. The amplified signal 58 is then sent to the processor unit 22 as illustrated in FIG. 1.

The signal-stabilizing unit 28, which is also shown in more detail in FIG. 2, comprises various components for down-converting the modulated microwave signal 46 received from the VT-DRO 42 to a lower baseband signal suitable for digital processing by the processor unit 22. In a specific embodiment illustrated in FIG. 2, a phase-locked voltage controlled oscillator (PLL VCO) 60 is locked to a clock signal 62 with a frequency $f_1$ and outputs an adjusted clock signal having frequency $f_2 = nf_1/m$, where n and m are integers typically called frequency divider parameters. In one embodiment, the PLL VCO 60 is an Analog Devices ADF4360 and is configured to produce an output signal of 2624.72 MHz from an input clock signal of 24.4912 MHz.

The adjusted clock signal 64 output by the PLL VCO 60 is provided to a frequency multiplier 66, which receives the adjusted clock signal 64 with frequency $f_2$ and produces a reference signal 68 having a frequency of $Nf_2$. In other words, the frequency multiplier 66 takes the adjusted clock signal 64 and produces an output signal at the $N^{th}$ harmonic of the frequency of the input signal 64. In one embodiment the frequency multiplier 66 is a Hittite Microwave HMC443LP4 Quadrupler and produces a 10.4988 GHz reference signal from a 2624.72 MHz input signal.

The signal-stabilizing unit 28 further comprises a mixer 70 for mixing the modulated microwave signal 46 and the reference signal 68 from the frequency multiplier 66. The mixer 70 multiplies these two signals to produce two output band signals. One of these signals is the up-conversion frequency band, having a frequency equal to the sum of the frequencies of the two input signals, while the other output signal is at the down-conversion band and has a frequency equal to the difference between the frequencies of the signals 46 and 68. These two output signals 72 from the mixer 70 are provided to a low pass filter 74, which passes through the down-conversion signal of the output signals 72, while filtering out the up-conversion signal of the output signals 72. In one embodiment, the low pass filter cut-off frequency is 50 MHz such that the low pass filter 74 will pass frequencies lower than 50 MHz, while stopping frequencies higher than 50 MHz.

The signal-stabilizing unit 28 further comprises an amplifier 80, which receives the down-conversion component 78 of the output signal 72 received from the low-pass filter 74. The amplifier 80 amplifies this down-converted signal 78 to a level sufficient for direct counting by digital circuits, to obtain the proportional calibration signal 40, which is sent to the processor unit 22 as illustrated in FIG. 1.

Figure 3:
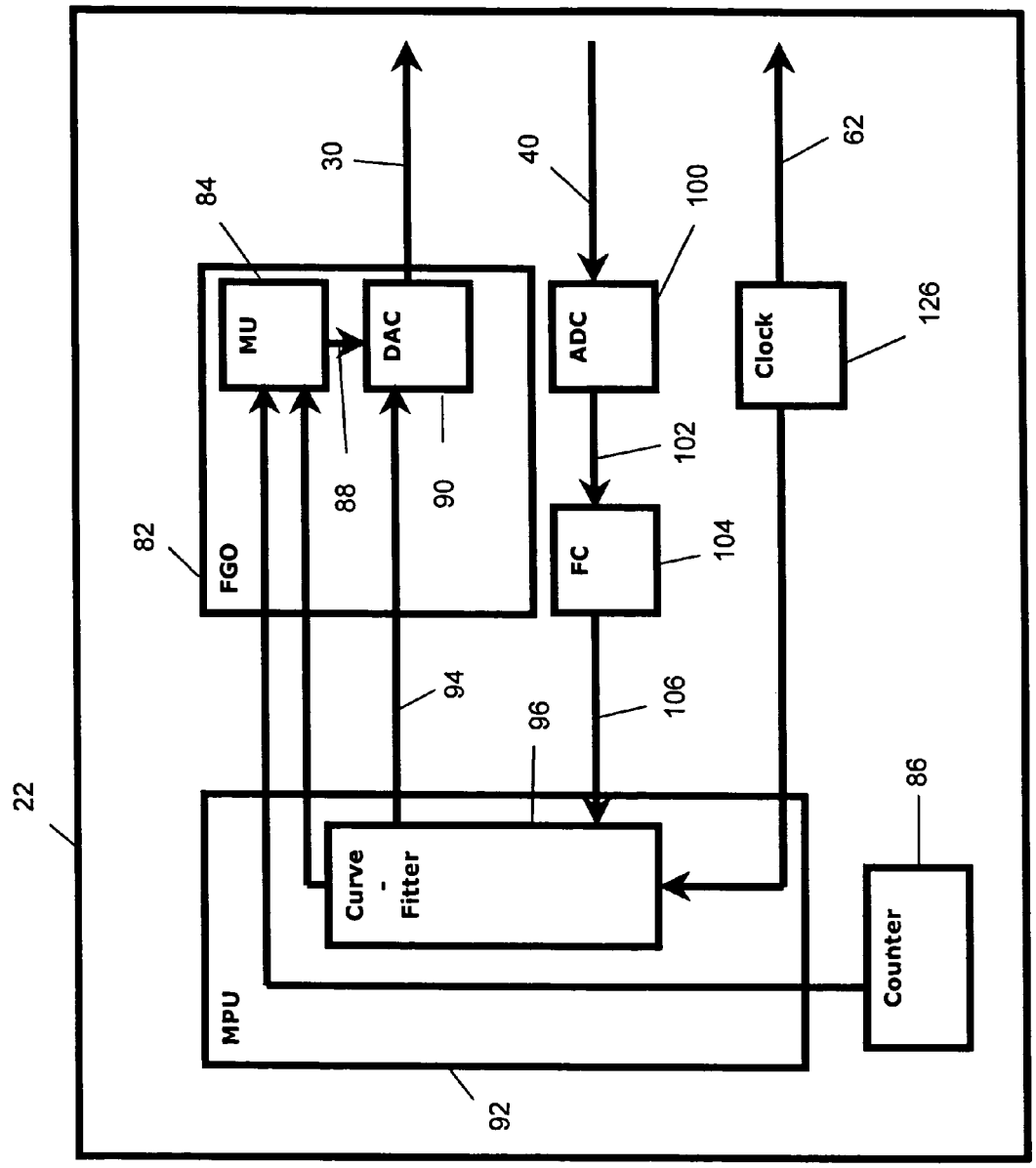
FIG. 3, in a block diagram illustrates a processor unit of the traffic sensor of FIG. 1; and, FIG. 4, in a flowchart, illustrates a method of determining a non-linear curve representing a signal to be fed to the transceiver unit to provide a substantially linear output signal from the transceiver unit in accordance with a further aspect of the invention.

Referring to FIG. 3, the processor unit 22 is illustrated in more detail in a block diagram. The elements of the processor unit 22 illustrated in FIG. 3 correct the programmable time-varying modulating signal 30 to increase the linearity of the modulated microwave signal 32 generated by the transceiver unit 24 based on the programmable time-varying modulating signal 30. In general, frequency modulated continuous wave radar works most effectively when the modulated microwave signal from the transceiver is linearly modulated.

The programmable time-varying modulating signal 30 is generated by a frequency generation oscillator (FGO) circuit 82. Since the VT-DRO 42 (as shown in FIG. 2) is a non-linear device, to produce a linear output the input to the VT-DRO 42 must be non-linear. The non-linear function required to produce a linear output can be approximated by the function $N(x) = Ax^2 + Bx + C$, where the A coefficient denotes the non-linear part, the B coefficient denotes the primary modulation slope and the C coefficient relates to the centre frequency. The FGO circuit 82 comprises a memory unit (MU) which stores a fixed number of values of the function $N(x) = Ax^2 + Bx + C$.

The processor unit 22 further comprises a counter 86, which is used to count from 1 to N and then down from N to 1 where N is the number of function values 88 stored in the memory unit 84. When the processor unit 22 is running in normal mode, the number generated by the counter 86 is sent to the FGO circuit 82 where it is used to retrieve the function value 88 written at that address of the memory unit 84. Once retrieved, the function value 88 is sent to a digital-to-analog converter (DAC) 90, which produces the time-varying modulating signal 30 based on the function value 88 received from the memory unit 84.

While the processor unit 22 generally runs in normal mode, at a fixed interval it switches into calibration mode. According to one embodiment the calibration mode interval is set at 3 minutes. In calibration mode, the system runs the curve-fitting process illustrated in the flowchart of FIG. 4. The curve-fitting process involves determining three points on the curve represented by the function $N(x)=Ax^2+Bx+C$, and then using those three values to determine the coefficients, A, B and C. To determine a point on the $N(x)$ curve, one has to determine the value of $N(x1)$ and the value of $x1$. To determine both $N(x1)$ and $x1$ the Micro Processing Unit (MPU) 92 varies an input signal 94 provided to the DAC 90. More specifically, a curve fitter function 96 provided by the MPU 92 varies the input signal 94 provided to the DAC 90 until the frequency of the output signal 46 from the VT-DRO 42 (see FIG. 2) reaches a pre-determined frequency. At that point, the value of the input signal 94 will be $N(x1)$ and the $x1$ value is calculated from the desired frequency. Subsequently, the MPU 92 will know where on the ideal linear curve that the desired frequency sits. Thus, the MPU 92 will know that it has to use the $N(x1)$ value at the equivalent time in its cycle, which is $x1$.

Figure 4:
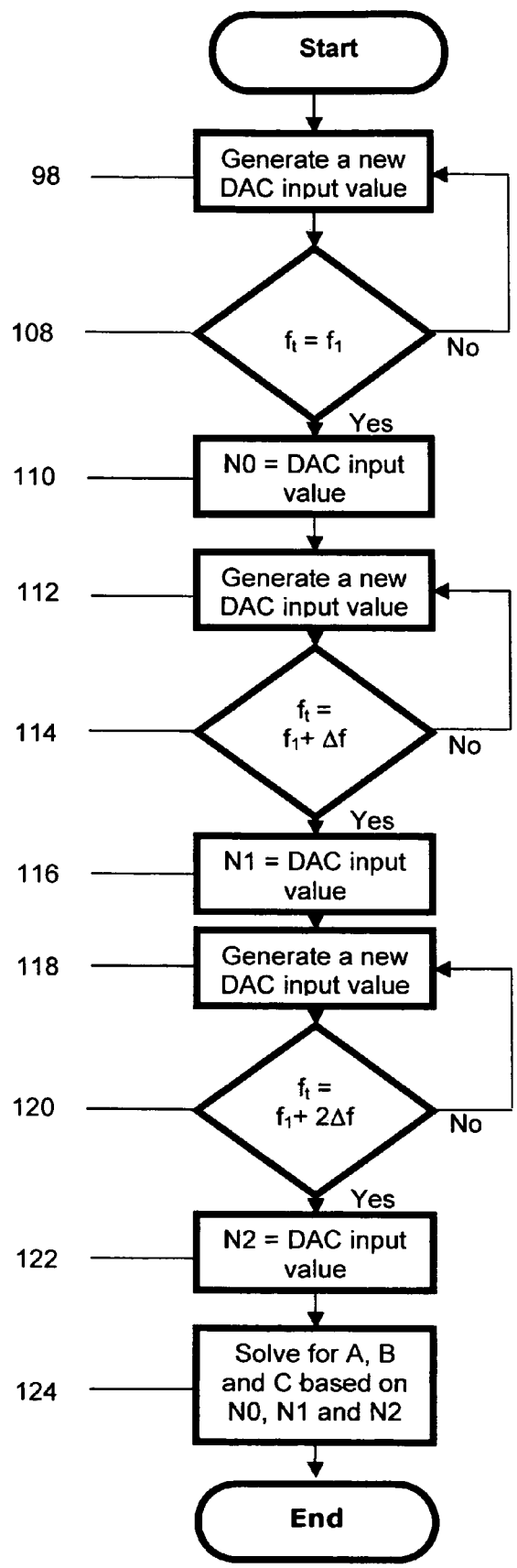

Referring to FIG. 4, there is illustrated in a flow chart a curve-fitting process in accordance with a further aspect of the invention. The curve-fitting process begins with step 98 in which the curve fitter 96 of the MPU 92 sends signal 94 to the DAC 90 in an attempt to generate frequency $f_1$. Based on the signal 94, the DAC 90 generates the programmable time-varying modulating signal 30, which is received by the transceiver unit 24 as shown in FIG. 1. As described above in connection with FIG. 2, the proportional calibration signal 40 is derived from the output signal 46 from the VT-DRO 42. Referring back to FIG. 3, this proportional calibration signal 40 is fed back to an analog-to-digital converter (ADC) 100, which generates an equivalent digital signal 102, which is transmitted to a frequency counter 104, which reads the frequency of the signal 102. This frequency reading is equal to the sum of the frequency of the signal 102 from the ADC 100 and the frequency of the reference signal 68 (FIG. 2). This calculated transmit frequency is then compared to $f_1$. If the calculated transmit frequency is not equal to $f_1$ (within a selected tolerance), then query 108 of the method of FIG. 4 returns the value "NO" and the curve fitter 96 of the MPU 92 returns to step 98. When, however, the calculated transmit signal is equal to $f_1$ then query 108 returns the value "YES" and the curve fitter 96 of MPU 92 proceeds to step 110 where the DAC input value 94 that produced the $f_1$ is stored as N0.

In step 112, the curve fitter 96 adjusts value 94 sent to the DAC 90 in an attempt to generate a second frequency $f_1+\Delta f$, which is now the desired frequency. If the calculated transmit frequency, determined as described above, is not equal to the desired frequency, then the query 114 returns the value "NO" and the curve fitter 96 returns to step 112 to adjust DAC input value 94. When, however, the calculated transmit signal is equal to the desired frequency, query 114 returns the value "YES" and the process proceeds to step 116 in which the DAC input value 94 that produced the desired transmit frequency is stored as N1.

In step 118 the curve fitter 96 once again adjusts DAC input signal 94 in an attempt to generate a frequency of $f_1+2\Delta f$, which is now the desired frequency. If the calculated transmit frequency, determined as described above, is not equal to the desired frequency, then the query 120 returns the value "NO" and the curve fitter 96 returns to step 118 to adjust the DAC input value 94. If, on the other hand, the calculated transmit signal equals the desired frequency then query 120 returns the value "YES" and the curve fitter 96 proceeds to step 122 where the DAC input value 94 that produced the desired transmit frequency is stored as N2.

Once N0, N1 and N2 have all been determined in steps 110, 116 and 122 respectively, the curve fitter 96 solves for coefficient A, B and C from the N0, N1 and N2 values in step 124. Then, if the coefficients result in a polynomial $N(x)$ that is different from the one that had been used during the previous normal operation mode, then the new $N(x)$ is used to generate new $N(x)$ values, and the memory unit 84 is updated with the new $N(x)$ values. The manner in which the processor unit 22 switches between the normal mode of operation and the calibration mode of operation is described in more detail below.

As described above, the counter 86 of the processor unit 22 is used to count from 1 to N and then down from N to 1 where N is the number of function values stored in the memory unit 84. In one embodiment, it takes very little time—say half a millisecond—for the memory unit to count up from 1 to N, or down from N to 1. This feature of the processor unit 22 is important in the switch between the normal mode and calibration mode of operation in this embodiment as described below.

According to one embodiment, the processor unit 22 comprises a clock 126, which in addition to providing the clock signal 62 described above in connection with FIG. 2, also determines whether a pre-defined calibration mode interval such as, say 3 minutes, has elapsed. If this calibration mode interval has elapsed, then during the half millisecond in which the counter 86 is counting down from N to 1 the curve-fitter 96 will temporarily interrupt the signal 88 sent from the memory unit 84 to the DAC 90, and instead transmit the signal 94 directly from the curve fitter 96 to the DAC 90. This signal 94 is adjusted as described above to calibrate the programmable time-varying modulating signal 30 output by the DAC to linearize the modulated microwave signal 32 from the transceiver unit 24. It will, of course, be apparent to those of skill in the art that calibration might occur more frequently or less frequently or alternatively might proceed concurrently with the normal mode of operation by simply monitoring the particular proportional calibration value 40 provided by a particular signal 88 from the MU during the normal mode of operation.

Preferably, the memory unit 84 comprises two distinct memories. After the curve-fitter 96 has determined N0, N1 and N2 in steps 110, 116, and 120 respectively, and is solving for the polynomial function $N(x)$ in step 124, one component of the memory unit 84 can continue to supply values 88 to the DAC 90. In fact, this component of memory unit 84 can continue to supply values 88 to the DAC 90 even while the other component of the memory unit 84 is updated to include the new values determined using the new polynomial functions $N(x)$. Then, when all of the new values have been stored, the memory unit can be immediately switched from one component of the memory to the other component of the memory in which the new values of the polynomial $N(x)$ are stored. The other memory component can then be used to store the values of the next polynomial function $N(x)$ determined during the next calibration mode.

Other variations and modifications of the invention are possible. All such modifications or variations are believed to be within the sphere and scope of the invention. As defined by the claims appended hereto.

The invention claimed is:

1. A vehicular traffic sensor for mounting at a fixed location to monitor multiple lanes of traffic, the vehicular traffic sensor comprising:

a processor unit for generating a programmable time-varying frequency modulating signal;

a transceiver unit for receiving the programmable time-varying frequency modulating signal from the processor unit and for generating a linear frequency modulated microwave signal based on the programmable time-varying frequency modulating signal;

at least one antenna for (i) receiving the linear frequency modulated microwave signal from the transceiver unit, (ii) forming a radiation beam, (iii) radiating the linear frequency modulated microwave signal in the radiation beam at an object; and, (iv) receiving the modulated microwave signal reflected back from the object; and a signal stabilizing unit for receiving a portion of the linear frequency modulated microwave signal from the transceiver unit and for providing a proportional calibration signal back to the processor;

wherein the processor unit is further operable to (i) receive the calibration signal from the signal stabilizing unit, (ii) measure frequency parameters of the calibration signal, and (iii) correct the programmable time-varying frequency modulating signal based on the frequency parameters of the calibration signal to increase the linearity of the modulated microwave signal; and the processor comprises a curve-fitting module for determining an inverse non-linear function from the frequency parameters of the calibration signal, the processor unit being operable to generate the programmable time-varying frequency modulating signal based on the inverse non-linear function to compensate for distortion introduced by the transceiver unit.

2. The traffic sensor as defined in claim 1 wherein the processor further comprises a memory for storing an ordered sequence of numbers calculated using the inverse non-linear function, and a DAC for generating the time-varying modulating signal as a time-ordered sequence of voltages determined based on the ordered sequence of numbers, and the transceiver comprises a voltage controlled oscillator for generating the modulated microwave signal based on the programmable time-varying frequency modulating signal generated by the DAC.

3. The traffic sensor as defined in claim 2 wherein the voltage controlled oscillator is a voltage tunable dielectric resonator oscillator.

4. The traffic sensor as defined in claim 2 wherein the curve-fitting module comprises (i) a frequency-measurement counter circuit for measuring the calibration signal frequency at three frequency levels resulting from setting the programmable time-varying modulating signal at three different signal levels, (ii) calculating from the three frequency levels the inverse non-linear function required and (iii) generating the sequence of numbers based on the inverse non-linear function.

5. The traffic sensor as defined in claim 2 wherein the memory comprises a dual port memory having a pair of independent memory components wherein one memory component is operable to provide the ordered sequence of numbers to the DAC while a new ordered sequence of numbers for a new inverse non-linear function is being stored on the other memory component.

6. The traffic sensor as defined in claim 1 wherein the processor further comprises a re-calibration timing module for determining when to re-calibrate the inverse non-linear function.

7. The traffic sensor as defined in claim 1 wherein the signal stabilizing unit comprises (i) an oscillator for generating a reference-locked signal, the oscillator being phase-locked to a clock signal, and (ii) a down converter unit for generating the calibration signal at a difference frequency between the reference-locked signal and the microwave transceiver signal.

8. The traffic sensor as defined in claim 1 wherein the signal stabilizing unit comprises a frequency divider circuit for generating the calibration signal at a frequency proportional to the frequency of the microwave transceiver signal.

9. The traffic sensor as defined in claim 1 wherein the signal stabilizing unit comprises a frequency reduction module for reducing a calibration signal frequency prior to measuring the parameters of the calibration signal.

10. The traffic sensor as defined in claim 9 wherein the frequency reduction module comprises at least one of (i) a frequency divider circuit for generating a frequency proportional to the frequency of the microwave transceiver signal, and (ii) a down-converter to lower the calibration signal frequency.

11. The traffic sensor as defined in claim 1 wherein the curve-fitting module comprises (i) a frequency-measurement counter circuit for measuring the calibration signal frequency at three frequency levels resulting from setting the programmable time-varying modulating signal at three different signal levels, and (ii) calculating from the three frequency levels the inverse non-linear function required.

12. A method of operating a traffic sensor for mounting at a fixed location to monitor multiple lanes of traffic, the method comprising:

(a) generating a programmable time-varying frequency modulating signal;

(b) generating a linear frequency modulated microwave signal based on the programmable time-varying frequency modulating signal;

(c) radiating the linear frequency modulated microwave signal in a radiation beam at an object;

(d) providing a proportional calibration signal based on the linear frequency modulated microwave signal;

(e) measuring frequency parameters of the calibration signal, and (f) correcting the programmable time-varying frequency modulating signal based on the frequency parameters of the calibration signal to increase the linearity of the linear frequency modulated microwave signal; wherein step (f) further comprises determining and periodically updating an inverse non-linear function from the frequency parameters of the calibration signal, and step (a) comprises generating the programmable time-varying frequency modulating signal based on the inverse non-linear function to compensate for distortion introduced in step (b).

13. The method as defined in claim 12 wherein step (a) comprises storing an ordered sequence of numbers calculated using the inverse non-linear function, and generating the time-varying modulating signal as a time-ordered sequence of voltages determined based on the ordered sequence of numbers.

14. The method as defined in claim 13 wherein the traffic sensor comprises a dual port memory for storing the ordered sequence of numbers calculated using the inverse non-linear function, the dual port memory having a pair of memory components, the method further comprising providing the ordered sequence of numbers from one memory component to generate the time-varying modulating signal; and concurrently, storing a new ordered sequence of numbers for a new inverse non-linear function on the other memory component.

15. The method as defined in claim 12 wherein step (e) comprises reducing a calibration signal frequency prior to measuring the frequency parameters of the calibration signal.

16. The method as defined in claim 12 further comprising switching between a normal operation mode and a calibration mode, wherein step (f) occurs during the calibration mode.

17. The method as defined in claim 16 wherein, during the calibration mode, step (a) comprises setting the programmable time-varying frequency modulating signal at three different signal levels;

step (e) comprises measuring the calibration signal frequency at three frequency levels resulting from setting the programmable time-varying modulating signal at the three different signal levels;

step (f) comprises calculating the inverse non-linear function from the three frequency levels.

18. The method as defined in claim 12 wherein, during the calibration mode, step (a) comprises setting the programmable time-varying frequency modulating signal at three different signal levels;

step (e) comprises measuring the calibration signal frequency at three frequency levels resulting from setting the programmable time-varying modulating signal at the three different signal levels;

step (f) comprises calculating the inverse non-linear function from the three frequency levels.

* * * * *